US 7,417,429 B2

United States Patent
Fuderer et al.

(10) Patent No.: US 7,417,429 B2
(45) Date of Patent: Aug. 26, 2008

(54) MOVING TABLE MRI WITH SUBSAMPLING IN PARALLEL

(75) Inventors: Miha Fuderer, Eindhoven (NL); Paul Royston Harvey, Eindhoven (NL); Johan Samuel Van Den Brink, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 269 days.

(21) Appl. No.: 10/547,196

(22) PCT Filed: Feb. 18, 2004

(86) PCT No.: PCT/IB2004/050131

§ 371 (c)(1),
(2), (4) Date: Aug. 26, 2005

(87) PCT Pub. No.: WO2004/077086

PCT Pub. Date: Sep. 10, 2004

(65) Prior Publication Data

US 2006/0145696 A1   Jul. 6, 2006

(30) Foreign Application Priority Data

Feb. 28, 2003   (EP)   ................................. 03100506

(51) Int. Cl.
*G01V 3/00*   (2006.01)
(52) U.S. Cl. ........................ 324/309; 324/307; 324/318
(58) Field of Classification Search ......... 324/318–322, 324/309, 307, 306; 600/410, 422
See application file for complete search history.

(56) References Cited

U.S. PATENT DOCUMENTS 6,377,045 B1   4/2002   Van Den Brink (Continued)

FOREIGN PATENT DOCUMENTS

EP   1 024 371 A2   8/2000

(Continued)

OTHER PUBLICATIONS

Brittain, J.H., et al.; Whole-Body Imaging with a Continuously Moving Patient Table; 2002; Proc. Intl. Soc. Mag. Res. Med.; 10:2336.

(Continued)

*Primary Examiner*—Brij Shrivastav
*Assistant Examiner*—Tiffany A Fetzner

(57) ABSTRACT

A novel magnetic resonance imaging method is described, for forming an image of an object from a plurality of signals sampled in a restricted homogeneity region of a main magnet field of a magnetic resonance imaging apparatus. A patient disposed on a table is moved continuously through the bore of the main magnet and spins in a predetermined area of the patient are excited by an excitation pulse from a transmitter antenna, such that an image is formed over a region exceeding largely the restricted region. Data is undersampled in the restricted region by means off at least one receiver antenna in a plurality of receive situations being defined as a block of measurements contiguous in time having preserved magnetisation and presaturation conditions within the excited area of the patient. Fold-over artefacts due to said undersampling are unfolded by means of the known sensitivity pattern of the receiver antenna and/or the properties of selected factors determining said receive situations.

16 Claims, 2 Drawing Sheets

U.S. PATENT DOCUMENTS

| | | | |
|---|---|---|---|
| 6,794,869 B2 * | 9/2004 | Brittain | 324/309 |
| 6,801,035 B2 * | 10/2004 | Wang | 324/309 |
| 6,897,655 B2 * | 5/2005 | Brittain et al. | 324/309 |
| 7,009,396 B2 * | 3/2006 | Zhu et al. | 324/309 |
| 2002/0021128 A1 | 2/2002 | Kuhara | |
| 2002/0039024 A1 | 4/2002 | Fuderer et al. | |
| 2002/0074999 A1 | 6/2002 | Katscher | |
| 2002/0115929 A1 * | 8/2002 | Machida | 600/410 |
| 2002/0140423 A1 * | 10/2002 | Brittain | 324/301 |
| 2002/0173715 A1 * | 11/2002 | Kruger et al. | 600/410 |
| 2002/0175683 A1 * | 11/2002 | Mertelmeier et al. | 324/309 |
| 2003/0001571 A1 * | 1/2003 | Wang | 324/309 |
| 2003/0004408 A1 | 1/2003 | Zhu | |
| 2003/0011369 A1 * | 1/2003 | Brittain et al. | 324/309 |
| 2004/0051529 A1 * | 3/2004 | Zhu et al. | 324/318 |
| 2004/0155654 A1 * | 8/2004 | Brittain | 324/309 |
| 2006/0145696 A1 * | 7/2006 | Fuderer et al. | 324/309 |

FOREIGN PATENT DOCUMENTS

| | | |
|---|---|---|
| EP | 1 205 760 A2 | 5/2002 |
| EP | 1 398 642 A2 | 3/2004 |
| WO | WO 00/72050 A1 | 11/2000 |
| WO | WO 02/42791 A1 | 5/2002 |

OTHER PUBLICATIONS

Pruessmann, K.P., et al.; Coil Sensitivity Maps for Sensitivity Encoding and Intensity Correction; 1998; ISMRM; p. 2087.

Pruessmann, K.P., et al.; Coil Sensitivity Encoding for Fast MRI; 1998; ISMRM; p. 579.

Weiger, M., et al.; Accellerated Cardiac Brethhold Imaging Using Coil Sensitivity Encoding; 1998; ISMRM; p. 799.

Weiger, M., et al.; Cardiac Real-Time Acquisition Using Coil Sensitivity Encoding; 1998; ISMRM; p. 803.

Scheffler, "Fast Volume Coverage using Sliding, Nonuniform Angular Sampling: The Spiral CT Approach with Projection Flash and TrueFISP Sequences", 1774 ISMRM 2001.

Brittain, et al. "Incremental Table Motion for Increased Volume Coverage", 1726 ISMRM 2000.

Zhu, "Fusion for Incremental Field-of-View Imaging", 9 ISMRM 2001.

Kruger, et al., "Continuously Moving Table Data Acquisiton Method for Long FOV Cotnrast-Enhanced MRA and Whole-Body MRI", Abstract of MRM 47:224-231 (2002).

Dietrich, et al., "Diffusion-Weighted Imaging of the Spine Using Radial k-space Trajectories", Abstract of Magnetic Resonance Materials and Biology, Physics, and Medicine, V. 12, No. 1, Mar. 2001, pp. 23-31.

* cited by examiner

MOVING TABLE MRI WITH SUBSAMPLING IN PARALLEL

BACKGROUND

The invention relates to a magnetic resonance (MR) method for forming an image of an object from a plurality of signals sampled in a restricted homogeneity region of a main magnet field of the magnetic resonance imaging apparatus, whereas a patient disposed on a table is moved continuously through the bore of the main magnet, such that an image is formed over a region exceeding largely the restricted region of a main magnet field of the magnetic resonance imaging apparatus.

The invention also relates to an MR apparatus and a computer program product for carrying out such a method.

Since it is quite uncomfortable for a patient being disposed in a large bore of the main superconductive magnet of an MR imaging apparatus, there is a trend to use shorter magnets while moving the patient table or couch through the bore of the magnet. Such an apparatus is described e. g. in U.S. Pat. No. 6,385,478. In an MR imaging apparatus excitation pulses are applied to a restricted region of the magnet bore, in which the field is uniform. The data samples collected are Fourier transformed to form a volumetric image of the restricted region. A motor continuously moves a patient couch so that a region of interest passes through the region of good field. The collected data samples are corrected to compensate for the motion so that a volumetric image is formed of greater length than that of the restricted region.

The MR imaging as mentioned above takes quite a long time since it is performed with conventional imaging sequences and even an overlap between successively imaged volumes is preferred in order to discard artefacts produced by errors in the central region. Obviously, the r.f. transmit coil and the r.f. receive coil are disposed in the reference frame of the main magnet, i.e. in its direct vicinity. However, imaging by body coils disposed on different places of a patient was not an issue in this reference. Anyway, it is known that using body coils may cause additional artefacts which cannot be suppressed in an easy manner.

SUMMARY

Therefore, it is an object of the present invention to improve the MR imaging method with a relative short main magnet and a moving bed in such a manner, that imaging will be performed in a much shorter time period. Another object of the present invention is to provide an MR apparatus and a computer program product for carrying out the method.

The invention has the main advantage, that shorter main magnets with a restricted homogeneity region can be used whereas data can be sampled in a much shorter time due to undersampling and therefore the scan time is largely reduced in relation to conventional MR imaging with a moving table or bed. Another advantage of the present invention is that the direction of the field-of-view can be oriented in any direction, which means that e.g. flow artefacts can be oriented in an appropriate manner or to orient single slices to some preferred orientation with respect to the tissue structure of the patient.

These and other advantages of the invention are disclosed in the dependent claims and in the following description in which an exemplified embodiment of the invention is described with respect to the accompanying drawings.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION

Figure 1:
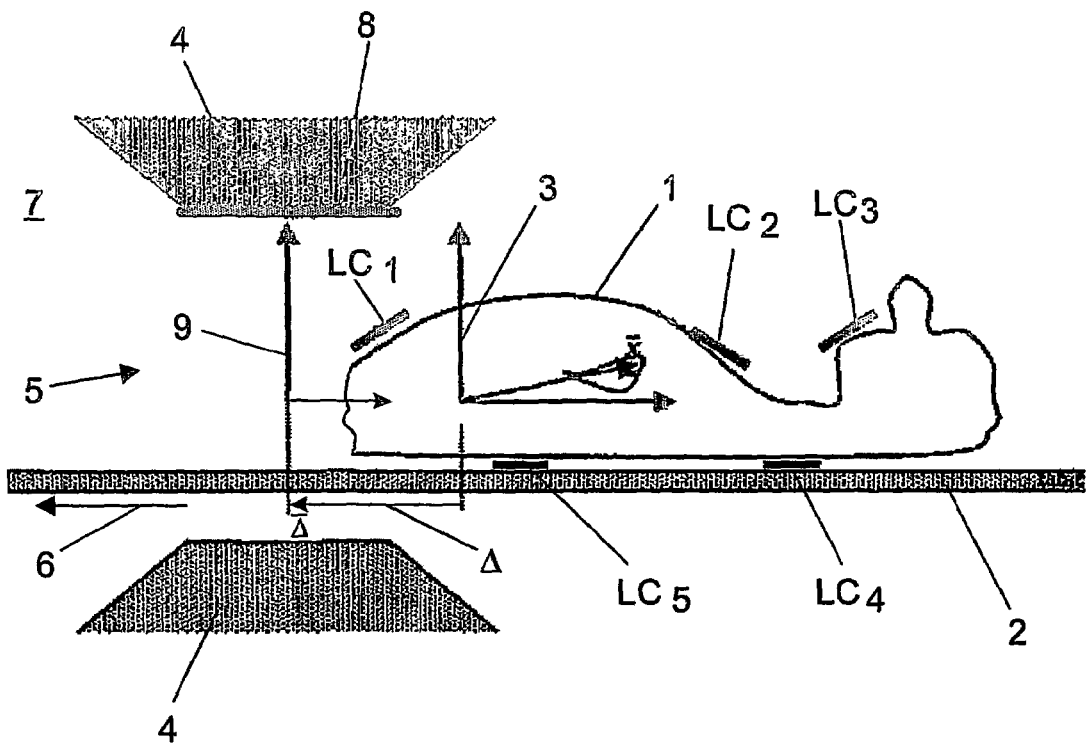
FIG. 1 diagrammatically a magnetic resonance imaging system in which the present invention is used, FIG. 2 an example of a acquisition scheme, FIG. 3 an acquisition scheme in k-space with a moving bed, and FIG. 4 a simplified presentation for explanation of the present invention.

In FIG. 1 a patient 1 is placed fixedly to a moving table or bed 2. A set of local coils $LC_1$ to $LC_5$ is located fixedly to the patient 1, thus the arrangement "patient 1", "bed 2" and "local coils $LC_1$ to $LC_5$" are disposed in a fixed relationship to each other in a coordinate system 3 which is related to the patient. A vector $\vec{x}$ denotes the position relative to this coordinate system or frame of reference 3. Further a main magnet 4 is provided with a bore 5, in which the bed 2 can be moved to and fro in direction of arrow 6. The magnet/gradient system 7 comprises the main magnet 4 and a number of receive coils 8—generally one or none—and a transmitter coil (not depicted). These receive coils 8 and transmit coils are denoted as being "global". The elements of the magnet/gradient system 7 are all related in another fixed relationship which is defined by another coordinate system 9 related to the main magnet 4. It is further assumed that the receive coils 8 and the transmit coils are large and have smooth sensitivity patterns in the direction of the bed motion (arrow 6). The magnet coordinate system 9 is offset by a distance $\vec{\Delta}$ relative to the patient coordinate system 3. The property of the patient 1, e.g. the proton density of his body, is obviously given in the patient coordinate system 3, expressed as $\rho(\vec{x})$. Ideally, the same holds for the receive-sensitivity pattern $S_i(\vec{x})$ of one of the local coils $LC_i$, where i=1 to 5. On the other hand, the sensitivity pattern of the receive coil 7 is written as $g_j(\vec{x} - \vec{\Delta})$.

Now the expression "receive situation" is introduced, which means a block of measurements contiguous in time, during which the table 2 has travelled a relatively small distance (e.g. one half or one third or something in between) of the "homogeneity size" of the main magnet 4. During a single receive situation all magnetisation preparations (like presaturation slabs, volume selections etc.) "travel" in principle with the patient 1. Also during a single receive situation, all of the interesting k-space is covered, except for any (potentially significant) undersampling. The full scan over k-space covers K receive situations. In principle, the MR acquisition sequence is identical over all receive situations, except that the "magnetisation preparations" may change place and that there may be some offset in the acquired k-space grid. This is however a refinement of the concept.

During any receive situation, every coil $LC_1$ to $LC_5$ receives information from the patient 1. And so (I+J) sets of information are delivered, where I is the number of local receive coils and J is the number of global receive coils. Some of these sets may be practically zero, e.g. if a receive coil $LC_1$ to $LC_5$ is completely outside the homogeneity volume of main magnet 4. There are K receive situations. Thus, in total, information has been gathered in K*(I+J) "receive instances".

Figure 2:
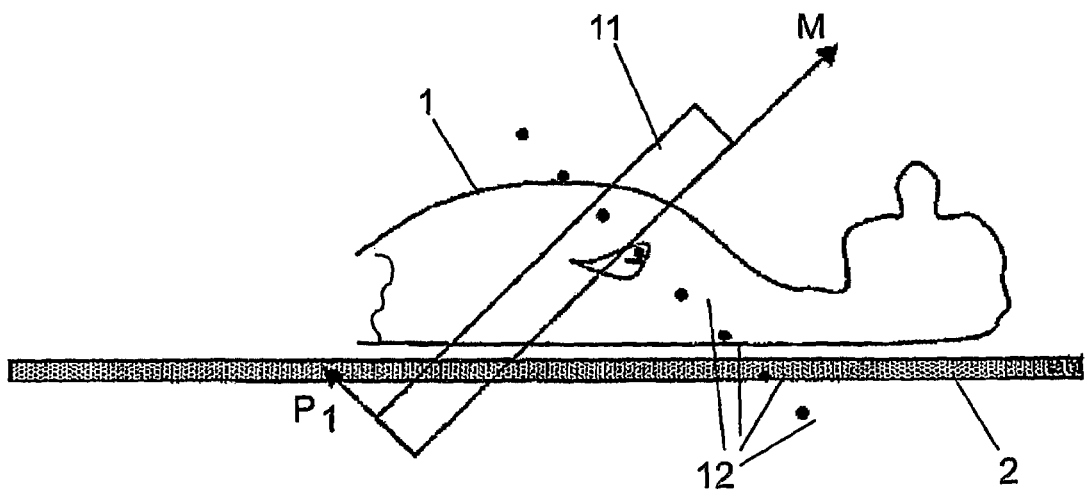

The clinical doctor wants information from a relatively large volume of interest of the patient 1. Data is acquired while the table or bed 2 is moving relative to the main magnet 4. The displacement Δ thereof relative to the magnet 4 is known at any time. The whole of the MR acquisition is split up in a number of receive situations. During each situation, the excitation and presaturation profiles "travel" with the patient 1. The acquired data are phase-corrected for the offset of table 2 at which they are acquired. During a receive situation, information from the patient 1 is acquired using any MR imaging sequence of any orientation. In practice it may be useful either to orient artefacts (e. g. flow artefacts) in an appropriate direction, or to orient single slices to some preferred orientation M with respect to a specific tissue structure of the patient. However, the information may be seriously undersampled. An example of this method is sketched in FIG. 2. For every receive situation, we acquire, nominally the volume indicated by a box 11. This means that a multitude of points 12 will fold onto the results of this receive situation. This multitude may be a one-dimensional row parallel to $P_1$, a two-dimensional row or even a continuum of folding locations which is the case in e. g. spiral acquisition.

Now, every receive situation has the same subsampling pattern. The only difference between different receive situations is the weighing with respect to the properties of following selected factors:
1. the excitation or saturation profile (with respect to the patient 1),
2. the transmit pattern of the transmit coil,
3. the receive patterns of the fixed receive coils 8, and
4. the frequency-response pattern of the receiver system.

Concerning items 2 and 3 it is remarked that in theory, with a moving table 2, these patterns varies also within a situation—but if the motion per situation is not exceedingly large, this may be neglected.

In addition, every receive coil (whether local or global) has its own sensitivity pattern. So every receive instance, which is the combination of a receive coil and a receive situation, "sees" a different "overall pattern", which is a product of the coil-sensitivity pattern and the combined pattern (excitation, saturation, transmit and frequency-response) of the receive situation.

The multitude of folding points 12 is unfolded using all the "overall patterns" of every receive instance. This is done in a manner as in the SENSE method (see e.g. K. Pruessmann et. al. in Proc. ISMRM, 1998, abstracts pp. 579, 799, 803 and 2087)—although, formally, the unfolding matrix may be larger. Nevertheless, the system of equations may be reasonably stable: e.g. for each situation, many folding points 12 may practically "see" a zero pattern, because they fall outside the excitation slab. It is further to be noted that the table motion is flexible: it may be linear, non-linear and even non-monotonic or two-dimensional. The restriction is that it must not travel excessively during one receive situation, e.g. no more as half the homogeneity volume.

In SENSE, a map of coil sensitivity profiles must be available. Such a map can be provided in a reference or coarse calibration measurement with a well-defined phantom. Another possibility is using a low-resolution map of the ratio of signals from an array coil element and from a reference coil of the patient on the table. In the present invention a similar reference measurement is provided. Although data can generally be acquired at any table-motion pattern, including two-dimensional table motion, here a linear one-dimensional movement will be used for data acquisition.

For a better understanding of the involved principles, first a review:
1. At each position of the patient ($\vec{x}$) some position-dependent tissue-properties (all data about proton density, $T_1$, $T_2$, flow, diffusion ...) are known
2. Also at each position of the patient ($\vec{x}$) the sensitivity pattern $S_i(\vec{x})$ of the local coils $LC_i$ can be obtained. Although there might be some dependence on $\vec{\Delta}$ due to coupling to global coils, this is neglected here.
3. The pattern of all the coils (global or local, transmit or receive) may be influenced by dielectric resonances, particularly at main magnet fields of 3T and higher. It is assumed that this effect can be seen as purely multiplicative on the coil sensitivity of all coils—an effect that is only dependent on the patient and the position therein, so not on the coil or coil-position. For a main magnet field of 1,5T the effect is negligible. The dielectric resonance effect is denoted as $D(\vec{x})$. Each coil actually "sees" with a sensitivity $D(\vec{x}) \cdot S_i(\vec{x})$.
4. The global coils also have their sensitivity pattern, which is approximated as being independent on the actual position of the patient within the magnet frame (except, of course, for dielectric resonance effect, which is explicitly accounted for). This sensitivity pattern is expressed as $g_j(\vec{x} + \vec{\Delta})$.
5. The total receive-pattern also may contain effects of receiver frequency response, denoted as $F(\vec{x} + \vec{\Delta})$ at a given readout gradient direction.

For a given measurement type, the transverse magnetisation is a non-linear effect depending on both the transmit pattern—i.e. on the position in the magnet coordinate system 9, if a global coil is used—and the tissue property—i.e. on the position in the patient coordinate system 3. Since this is very difficult to handle, an approximation is necessary, which can be achieved by using an FFE measurement with very small tip angles (about 5 degrees or less). In that case, the transverse magnetisation can be approximated as $f(\vec{x}) \cdot \alpha(\vec{x} + \vec{\Delta})$, where $f(\vec{x})$ is the "spin density" function, which is a tissue property for a given measurement (in the proposed case, it mainly depends on proton density). α is the tip angle, which is approximated as being proportional to $D(\vec{x}) \cdot g_{transmit}(\vec{x} + \vec{\Delta})$.

For the reconstruction of the proposed method as described in more detail below, ideally one would like to know all information of $S_i(\vec{x})$, $g_j(\vec{x} + \vec{\Delta})$ and $D(\vec{x})$ (but the last one is not crucial). The value of $F(\vec{x} + \vec{\Delta})$ is assumed to be known beforehand, and the value of $f(\vec{x})$ is (at least in principle) not an interesting result of the calibration measurement.

The problem is that not all these parameters are measured. For a given table position $\vec{\Delta}$, the following is measured:

the signal from local coils: $F(\vec{x} + \vec{\Delta}) \cdot S_i(\vec{x}) \cdot D(\vec{x}) \cdot g_{transmit}(\vec{x} + \vec{\Delta}) \cdot D(\vec{x}) \cdot f(\vec{x})$.

the signal from global coils: $F(\vec{x} + \vec{\Delta}) \cdot g_j(\vec{x} + \vec{\Delta}) \cdot D(\vec{x}) \cdot g_{transmit}(\vec{x} + \vec{\Delta}) \cdot D(\vec{x}) \cdot f(\vec{x})$.

A plain division of those two signals results in $S_i(\vec{x})/g_j(\vec{x}+\vec{\Delta})$—which is of no direct use if $g_j(\vec{x}+\vec{\Delta})$ is not uniform.

First Embodiment

The patterns of the global coils are assumed to be known (i.e. at least one of them). In practice, that function may be load-dependent, but this can be overcome by the fact that there is a calibrated load-dependency of the sensitivity function, and the load can be easily measured.

A number of discrete reference-scan segments are acquired. During such a segment, the table stands still. Each segment results in a full "image". The table is then stepped over a number of segments, so for a number of different values of $\vec{\Delta}$. The knowledge of $g_j(\vec{x}+\vec{\Delta})$ allows calculating the matrix $S_i(\vec{x})$. Mathematically, each segment would give the result over the full extent of $\vec{x}$, but in practice, each segment will provide accurate results only over a sub-range of all $\vec{x}$. These partially overlapping ranges can be combined using least-squares fits, resulting in the full map of $S_i(\vec{x})$.

Second Embodiment

Figure 3:
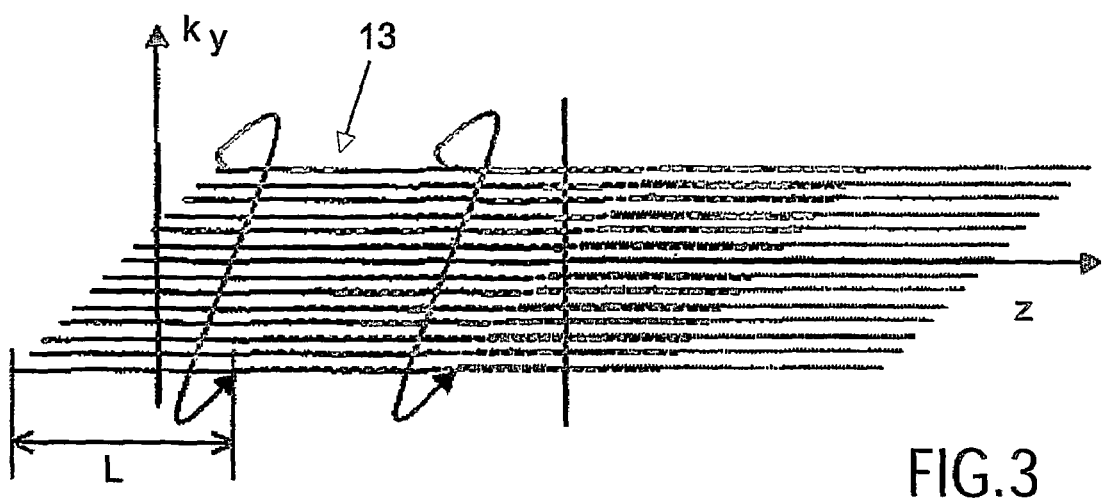

The three-dimensional measurement is oriented in such a way that the frequency-encoding is parallel to the table motion direction—the z-direction. The sampling bandwidth is very high in that direction. The other two directions are phase-encodings, one of which is "fast" compared to table motion. The "slow" phase-encoding direction is called $k_y$. In the patient coordinate system 9 the main magnet 4 is slowly moving with respect to the patient. During the motion of the magnet, profiles are acquired with linearly increasing $k_y$. In FIG. 3 a line segment 13 indicates the portion of the patient 1 that is detected by the homogeneity volume of the main magnet 4.

L is the distance that the main magnet 4 covers for a full set of phase-encoding profiles. The table speed is arranged in such a way that L is maximally half of the homogeneity volume—but less (e.g., ¼) is preferable. In FIG. 3 L is chosen at ½. The consequence is that every profile has been sampled for at least two different positions of the main magnet 4 (except for the outer edge regions, which are disregarded here). For example a profile $k_y$ has been measured for both the displacement $\vec{\Delta}_1$ and for the displacement $\vec{\Delta}_2$. This allows to approximate the profile that would have been measured if the main magnet 4 were at position $\vec{\Delta}_{ref}$ (as long as this value is in between $\vec{\Delta}_1$ and $\vec{\Delta}_2$). This can be done by interpolation (e.g. a linear interpolation if two profiles are available, or a cubic spline if there are four profiles). That can be done for every profile, which allows a complete reconstruction of the sensitivity-calibration measurement at magnet-offset $\vec{\Delta}_{ref}$.

However, this can also be done for any value of $\vec{\Delta}_{ref}$. That principle allows acquiring:

the signal from local coils: $F(\vec{x}+\vec{\Delta}) \cdot S_i(\vec{x}) \cdot D(\vec{x}) \cdot g_{transmit}(\vec{x}+\vec{\Delta}) \cdot D(\vec{x}) \cdot f(\vec{x})$.

the signal from global coils: $F(\vec{x}+\vec{\Delta}) \cdot g_j(\vec{x}+\vec{\Delta}) \cdot D(\vec{x}) \cdot g_{transmit}(\vec{x}+\vec{\Delta}) \cdot D(\vec{x}) \cdot f(\vec{x})$.

This holds, in contrary to the "problem section, not only for one value of $\vec{\Delta}$ but for all values thereof. This allows to:

separate the signal from local coils into $F(\vec{x}+\vec{\Delta}) \cdot g_{transmit}(\vec{x}+\vec{\Delta})$ and $S_i(\vec{x}) \cdot D(\vec{x}) \cdot D(\vec{x}) \cdot f(\vec{x})$, and separate the signal from global coils into $F(\vec{x}+\vec{\Delta}) \cdot g_j(\vec{x}+\vec{\Delta}) \cdot g_{transmit}(\vec{x}+\vec{\Delta})$ and $D(\vec{x}) \cdot D(\vec{x}) \cdot f(\vec{x})$.

This allows the derivation of $S_i \vec{x}$ and of $g_j(\vec{x}+\vec{\Delta})$. Actually, if F is known, then also $g_{transmit}(\vec{x}+\vec{\Delta})$ could be derived, but unfortunately not the dielectric resonance $D(\vec{x})$—but that is not crucial for the sequel.

Receiving and Reconstructing

The receiving and reconstruction of data has been explained above to a great extent. The data is acquired using relatively large steps between profiles, resulting in a (nominally) small "folding volume", i.e., into lots of folding. For non-cartesian sequences this means that data is sampled relatively sparse. The full extent of k-space is acquired during one scan situation, and the displacement during one scan situation is a fraction (e. g. ⅓) of the homogeneity volume. Every incoming sample is acquired at a very specific value of $\Delta_{sample}$. This is taken into account by multiplying every sample of the incoming data with $\exp(-ikT\Delta_{sample})$. Here, T is the coordination transformation from patient coordinates to scan coordinates, which is relevant for oblique scanning. That operation "displaces" the acquired data to the centre of the patient, even if that is way out of the homogeneity volume. Obviously, one can simplify things by correcting with a fixed $\Delta_{profile}$ per profile.

The scan situation has been acquired at an average offset $\vec{\Delta}_{ave}$. This is relevant to estimate:

the transmit profile for that situation: $g'_{transmit}(\vec{x}) = g_{transmit}(\vec{x}+\vec{\Delta}_{ave})$, similarly for the global-coils receive profile, and similarly for the frequency response function for that situation.

The excitation profiles and presaturation profiles are fixed to the patient coordinate system, i.e. travelling with the table 2 as seen from the main magnet 4. So these are known in $\vec{x}$. Also the local coil profiles are known in $\vec{x}$ (see calibration section). All these coil profiles can be multiplied into an overall receive pattern for each coil. In total, if there are K receive situations, then information has been gathered in K∘(I+J) receive instances. Each instance has a different overall receive pattern. This allows for a SENSE-like reconstruction, if there are less than K∘(I+J) folded points over the entire patient 1. In principle, the acquisition stays the same over all receive situations. As a refinement, the phase encoding may be offset by a small amount. This will give some extra phase-encoding, on top of all other mentioned encodings, which will improve the stability of the SENSE-reconstruction.

Geometric Correction

All of above reasoning assumes a perfectly linear gradient system. It assumes that a table-displacement of $\vec{\Delta}$ will cause (a) some different weighting, which has been extensively treated above, and (b) a phase modification of $\exp(ik.T\Delta_{sample})$ to a sample. Unfortunately, geometric distortion is another significant complicating factor. An image acquired at offset $\vec{\Delta}_1$ is geometrically distorted when compared to an image acquired at offset $\vec{\Delta}_2$, even if all weightings and the displacement ($\vec{\Delta}_2-\vec{\Delta}_1$) have been accounted for.

Figure 4:
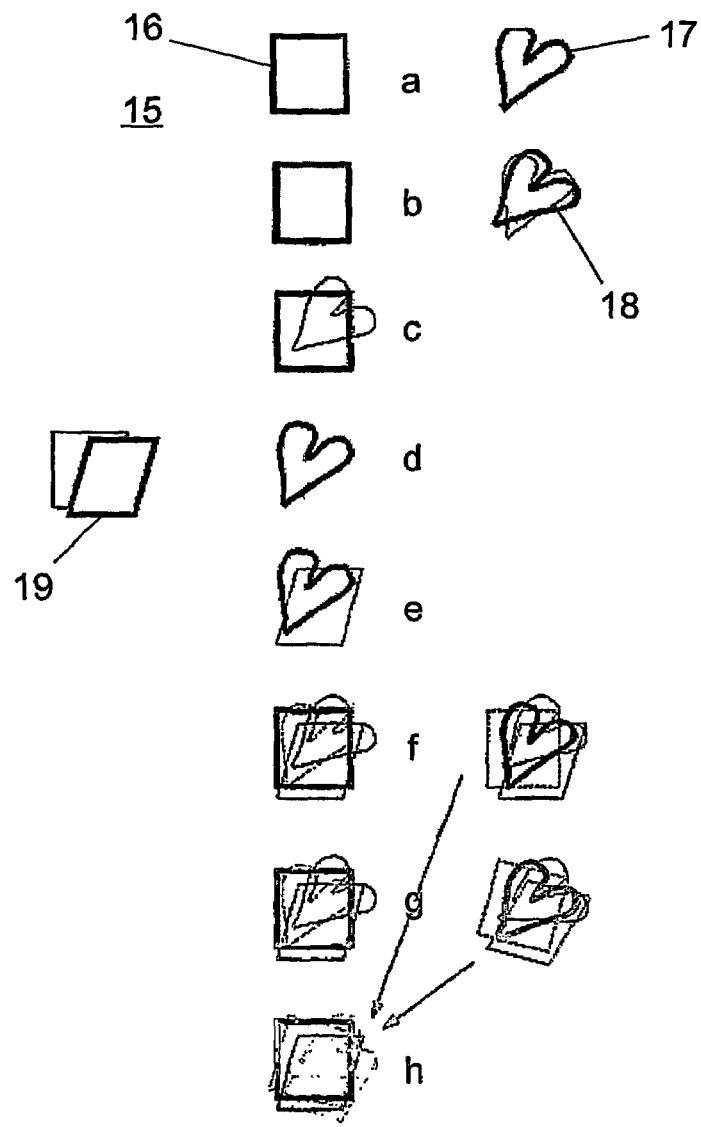

This problem can be solved since the distortions tend to be small where the excitation and transmit profiles tend to be large. This can be accomplished (a) by making sequences in such a way that there is not too much excitation in geometrically inhomogeneous areas, and (b) by designing the system with low transmit-sensitivity in these areas. The solution is an iterative reconstruction, the explanation thereof is given visually in FIG. 4. The main idea is, in essence, to first reconstruct the resulting image by disregarding the presence of geometric distortion. Of this result, all image regions are distorted in as many ways as there are scan situations. The distorted minus the undistorted versions provide an estimate of "folding distortion-errors". If the contributions (or weights) of every receive-instance to the final image are known, the estimate of the folding distortion-errors can be extracted from the result.

In FIG. 4(a) a very simplified patient 15 is depicted which diagrammatically includes two parts at different positions: a first part shown as block 16 and a second part shown as heart 17. FIG. 4(b) shows the imaging while the block 16 is largely in the centre of the main magnet and the heart 18 is more remote and thus distorted. As shown in FIG. 4(c) the distorted heart 18 folds onto the block 16, due to undersampling. Yet, the heart 18 is fainter, since it has seen less excitation. In another receive-situation according to FIG. 4(d), the heart 17 is in the centre of the main magnet 4 and the block 19 is more remote and thus distorted. Due to undersampling, this is measured in that receive-situation, as shown in FIG. 4(e). So the images in FIG. 4(c) and FIG. 4(e) are actually measured, FIG. 4(f) shows the result after SENSE-unfolding, which consists of two linear combinations of FIG. 4(c) and FIG. 4(e). It is imperfect, e. g. the right part of it includes the block 16 plus an unsubtracted heart 18 plus a "wrongly subtracted" heart 17 (dashed) and a second-order error (dotted). In FIG. 4(g) is shown a purposely distortion in the same manner as in (b), under the condition that (f) is available. FIG. 4(h) shows the final result where part of (f) is subtracted from its folded counterpart, and part of (g) is added, resulting in only second-order artefacts.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A magnetic resonance imaging method for forming an image of a region of a patient that is larger than a restricted homogeneity region of a main magnet field of a magnetic resonance imaging apparatus from a plurality of parallel imaging signals sampled in the restricted homogeneity region, the method comprising:
continuously moving a patient through the restricted homogeneity region of the main magnet field;
exciting spins in an area of the patient in the restricted homogeneity region with an excitation profile as the patient moves through the main magnetic field;
undersampling resonance data in the restricted homogeneity region with parallel receiver antennae which each have a sensitivity pattern as the patient moves through the main magnet field to define a block of measurements contiguous in time having preserved magnetisation and presaturation conditions within the excited region of the patient; and
generating the image of the region of the patient that is larger than the restricted homogeneity region including unfolding fold-over artifacts due to the undersampling using (a) the sensitivity patterns of the receiver antennae and (b) at least one of:
the excitation profile,
a magnetization and presaturation profile, and
a frequency-response pattern of a receiver.

2. A magnetic resonance imaging method for forming an image of an object from a plurality of signals sampled in a restricted homogeneity region of a main magnet field of a magnetic resonance imaging apparatus, wherein a patient disposed on a table is moved continuously through the bore of the main magnet and spins in a predetermined area of the patient are excited by an excitation pulse from a transmitter antenna, such that an image is formed over a region exceeding largely the restricted region, wherein data is undersampled in the restricted region by means of at least two receiver antennas in a plurality of receive situations being defined as a block of measurements contiguous in time having preserved magnetisation and presaturation conditions within the excited area of the patient, and fold-over artefacts due to said undersampling are unfolded by means of the sensitivity pattern of the receiver antennas.

3. A method as claimed in claim 2, wherein the fold-over artefacts are unfolded by means of the magnetisation and presaturation profile.

4. A method as claimed in claim 2, wherein the fold-over artefacts are unfolded by means of the frequency-response pattern of the receiver.

5. A method as claimed in claim 2, wherein during parallel image sampling of data within the restricted homogeneity region the table is moved over at most one half of the size of the restricted homogeneity region.

6. A computer program product stored on a computer usable medium for forming an image, comprising a computer readable program means for causing the computer to perform the method as claimed in claim 2.

7. A magnetic resonance imaging apparatus having a processor programmed to perform the method as claimed in claim 2.

8. The method as claimed in claim 2, further including defining slices in a canted orientation to orient artifacts in a preselected direction.

9. A magnetic resonance imaging method comprising:
forming a restricted homogeneity region of a main magnet field with a main magnet system of a magnetic resonance imaging apparatus;
continuously moving a patient disposed on a table through the restricted homogeneity region of the main magnet system;
exciting spins in a predetermined area of the patient with excitation pulses from a transmitter antenna as the patient moves through the restricted homogeneity region;
undersampling data from the restriction region with at least one global receiver antenna disposed in a fixed relationship to the main magnet system and a plurality of local receiver antennae disposed in a fixed relationship to the patient on the table to move therewith and generate a block of parallel measurements contiguous in time having preserved magnetization and presaturation conditions within the excited area of the patient;

reconstructing the block of parallel measurements in order to generate images which have fold-over artifacts due to the undersampling, the generated images spanning an imaged region of the patient which is larger than the restricted homogeneity region; and unfolding the fold-over artifacts using sensitivity patterns of the global and local receiver antennae.

10. A method as claimed in claim 9, wherein a reference scan is performed in order to obtain the sensitivity patterns of the global and local receiver antennae.

11. A method as claimed in claim 10, wherein data is acquired in a number of discrete reference scan segments at different table positions in the restricted region, wherein during each reference scan the table stands still, and from the data obtained by the reference scans the sensitivity patterns of the local receiver antennae are calculated.

12. A method as claimed in claim 10, wherein the table is moved at a speed which is less than half of the restricted homogeneity region of the main magnet system over the scan time of k-space, k-space being continuously scanned in a row-to-row manner, and the sensitivity profiles of the local receiver antennae being calculated by interpolation of the measured profiles at different table positions.

13. A magnetic resonance imaging method configured to form an image of an object from a plurality of parallel imaging signals sampled in a restricted homogeneity region of a main magnet field of a magnetic resonance imaging apparatus, wherein a patient disposed on a table is moved continuously through the bore of the main magnet and spins in a predetermined area of the patient are excited by an excitation pulse from a transmitter antenna, such that an image is formed over a region exceeding the restriction region, wherein data is undersampled in the restriction region by means of at least two receiver antennas in a plurality of receive situations being defined as a block of undersampled measurements contiguous in time having preserved magnetization and presaturation conditions within the excited area of the patient and fold-over artifacts due to said undersampling are unfolded by means of the sensitivity pattern of the receiver antenna, wherein the sampled data is reconstructed in an iterative manner, in that data sampled largely offset of the centre of the main magnet, which is folded-in on the data sampled in the centre of the main magnet and is reconstructed to form a folded-in image, is purposely distorted such that an undistorted image is reconstructed and subtracted from the folded-in image.

14. A magnetic resonance imaging apparatus configured to obtain an MR image from a plurality of parallel imaging signals comprising:

a main magnet which generates a main magnet field having a restricted homogeneity region, a transmitter antenna which excites spins in a predetermined area of the patient with an excitation profile, at least two receiver antennas which sample a plurality of parallel imaging signals in a restricted homogeneity region of the main magnet field, a table configured to bear a patient, means for continuously moving the table through the restricted homogeneity region of the main magnet field, means for adapting the frequency profile of the transmitter antenna and the frequency profile of the receiver antenna to the position of the continuously moving table relative to a reference point during the parallel sampling of the parallel imaging signal, means for sampling the data from the spins excited in the restricted homogeneity region in a given receive situation being defined as a block of measurements contiguous in time with preserved magnetisation and presaturation conditions in the excited area of the patient, and means for unfolding fold-over artefacts due to undersampling by means of the sensitivity pattern of the at least two receiver antennas and at least one of:
the excitation profile,
a magnetization and presaturation profile, and
a frequency-response pattern of at least one receiver that demodulates the data sampled by at least one of the at least two receiver antennas.

15. A magnetic resonance imaging apparatus configured to obtain an MR image from a plurality of signals comprising:

a main magnet system which generates a main magnet field having a restricted homogeneity region, a table configured to bear a patient, a means for continuously moving the table through a bore of the main magnet system, a transmitter antenna configured to excite spins in a predetermined area of the patient, a plurality of receiver antennae configured to sample a plurality of parallel imaging signals from the restricted homogeneity region in a given receive situation, the parallel imaging signals being defined as a block of measurements contiguous in time with preserved magnetization and presaturation conditions in the excited area of the patient, the plurality of receiver antennae including at least one global receiver antenna disposed at a fixed relationship to the main magnet system and a plurality of local receiver antennae disposed in a fixed relationship to the patient on the table, a means for adapting a frequency profile of the transmitter antenna and a frequency profile of the receiver antennae during the sampling of the parallel imaging signals to the position of the continuously moving table relative to a reference point, and means for unfolding fold-over artifacts due to undersampling by means of the sensitivity pattern of the receiver antennae.

16. A computer program product stored on a computer usable medium for forming an image, comprising a computer readable program means for causing the computer to control the execution:

creating a main magnetic field by a main magnet, exciting spins in a predetermined area of the patient by a transmitter antenna, undersampling a plurality of parallel acquired signals in a restricted homogeneity region of the main magnet field by at least two parallel imaging receiver antennas, continuously moving a table bearing a patient through a bore of the main magnet, adapting a frequency profile of the transmitter antenna and a frequency profile of the receiver antennas to the position of the continuously moving table relative to a reference point, the undersampling of parallel acquired signals in the restricted region in a given receive situation being defined as a block of measurements contiguous in time with preserved magnetisation and presaturation conditions in the excited area of the patient, and generating an image of a region of the patient longer than the restricted homogeneity region including unfolding fold-over artefacts due to said undersampling, the unfolding being in conjunction with the sensitivity patterns of the parallel imagine receiver antennas and at least one of:
the excitation profile,
a magnetization and presaturation profile, and
a frequency-response pattern of a receiver that demodulates the signals sampled by the at least two receiver antennas.

* * * * *